United States Patent
Shiramizu

[19]
[11] Patent Number: 6,116,254
[45] Date of Patent: Sep. 12, 2000

[54] CLEANING METHOD AND SYSTEM OF SEMICONDUCTOR SUBSTRATE AND PRODUCTION METHOD OF CLEANING SOLUTION

[75] Inventor: Yoshimi Shiramizu, Tokyo, Japan

[73] Assignee: NEC Corporation, Japan

[21] Appl. No.: 08/627,242

[22] Filed: Apr. 1, 1996

[30] Foreign Application Priority Data

Mar. 30, 1995 [JP] Japan .................................. 7-072927

[51] Int. Cl.⁷ .................................................. B08B 3/00
[52] U.S. Cl. ................ 134/99.1; 134/100.1; 134/102.3; 134/902
[58] Field of Search ............................. 134/102.3, 99.2, 134/100.1, 902

[56] References Cited

FOREIGN PATENT DOCUMENTS

| | | | |
|---|---|---|---|
| 56-150818 | 11/1981 | Japan . | |
| 3-159237 | 7/1991 | Japan ..................................... | 134/902 |
| 3-228328 | 10/1991 | Japan ..................................... | 134/902 |
| 3-229416 | 10/1991 | Japan ..................................... | 134/902 |
| 3-270132 | 12/1991 | Japan ..................................... | 134/902 |
| 3-283429 | 12/1991 | Japan ..................................... | 134/902 |
| 4-792221 | 3/1992 | Japan ..................................... | 134/902 |
| 4-79324 | 3/1992 | Japan ..................................... | 134/902 |
| 4-83340 | 3/1992 | Japan ..................................... | 134/902 |
| 4-127431 | 4/1992 | Japan ..................................... | 134/902 |
| 4-302144 | 10/1992 | Japan ..................................... | 134/902 |
| 4-348029 | 12/1992 | Japan ..................................... | 134/902 |
| 4-357836 | 12/1992 | Japan ..................................... | 134/902 |
| 7-263391 | 10/1995 | Japan . | |

*Primary Examiner*—Frankie L. Stinson

[57] ABSTRACT

A cleaning method for a semiconductor substrate is provided. After pure water is supplied to a cleaning tank, a chlorine gas is supplied to the pure water to thereby generate chloride ions, hypochlorite ions, chlorite ions, and chlorate ions in the pure water. Then, a semiconductor substrate is immersed into the pure water containing the chloride ions, hypochlorite ions, chlorite ions, and chlorate ions. The fabrication cost of a semiconductor device and adverse effects on the earth environment can be reduced. The concentration of the dissolved chlorine gas in the pure water is preferably in the range from 0.003 to 0.3% by weight.

7 Claims, 6 Drawing Sheets

CLEANING METHOD AND SYSTEM OF SEMICONDUCTOR SUBSTRATE AND PRODUCTION METHOD OF CLEANING SOLUTION

BACKGROUND OF THE INVENTION

1. Field of the Invention

The present invention relates to a semiconductor substrate cleaning and more particularly, to a cleaning method and a cleaning system of a semiconductor substrate, and a production method of a cleaning solution used for the method, which are used for semiconductor device fabrication.

2. Description of the Prior Art

Recently, with the decreasing size and increasing integration-level of semiconductor devices, it has become indispensable during semiconductor device fabrication to clean the surface of a semiconductor substrate between fabrication process steps, thereby removing various contaminants adhered onto the surface.

To perform the cleaning process as above, wet cleaning treatment with the use of chemicals such as high-cleanliness organic solvents, strong acids, and strong alkalis has been employed. In this treatment, it is inevitable to use a large quantity of these chemicals at various stages.

For example, in the cleaning process for removing metallic contaminants on the surface of a semiconductor substrate, a large quantity of such a chemical solution as that prepared by mixing hydrochloric acid (HCl) (37% by weight) and hydrogen peroxide ($H_2O_2$) (30% by weight) with pure water at a volume ratio of 1:1:6 (which is called as an "hydrochloric acid hydroperoxide mixture (HPM) is used.

Use of such high-purity and high-concentration chemicals significantly affects the earth environment. Also, the cost of producing these chemicals and of disposing wastes generated therefrom is very high. Therefore, the industry has begun to review wet cleaning treatment which consumes a large quantity of the chemicals.

The Japanese Non-Examined Patent Publication No. 56-150818 published in 1981 discloses, although the application field is different from that of the invention, a cleaning method for removal of bacteria growing in the pure-water supplying piping system without using high-concentration chemicals. In this method, hypochlorous acid (HClO) and hypochlorous acid ions ($HClO^-$) are used as a cleaning agent, which are obtained by dissolving a trace of chlorine ($Cl_2$) gas in pure water to react therewith by bubbling of the chlorine gas. In this case, the cleaning agent containing the hypochlorous acid and hypochlorous acid ions are used as an alternative to simple pure water.

In this conventional method, if the cleaning agent contains a large quantity of chlorine gas, the chlorine tends to be left on the surface of the semiconductor substrate after the cleaning process. The remaining chlorine may corrode the aluminum (Al) wiring or interconnection of the semiconductor devices, resulting in the possibility of property or performance degradation of the semiconductor devices. In consideration of this effect, the concentration or content of the contained hypochlorous acid and hypochlorous acid ions is held to 0.1 ppm or below, respectively.

The inventor, Y, Shiramizu, and other researchers created and filed on Mar. 25, 1994 an invention relating to an epoch-making wet treatment method as the Japanese Patent Application No. 6-56106, which was disclosed in the Japanese Non-Examined Patent Publication No. 7-263391 published in October 1995. This method allows great decrease of the necessary amounts of high-purity and high-concentration chemicals.

With this method, pure water containing an extremely small amount of an electrolyte is prepared and then, it is electrolyzed to produce a special water, i.e., "electrolysis-activated water". The special water thus obtained is used for a wet treatment of the semiconductor substrate.

For removal of metallic impurities on the surface of the semiconductor substrate, a halogen or halide gas is used as the above electrolyte. In this case, the "electrolysis-activated water" is generated by the following process steps. First, a gaseous mixture containing at least one of chlorine ($Cl_2$) gas, hydrogen chloride (HCl) gas, hydrogen bromide (HBr) gas, and hydrogen iodide (HI) gas is prepared. Next, this mixture is dissolved into pure water in an electrolysis chamber or tank. An electrolysis reaction of the water is then caused by supplying electric energy, thereby generating the "electrolysis-activated water" from the anode area of the tank.

The metallic impurities left on the semiconductor substrate for some cause are typically bonded to silicon (Si) or exist as oxides and therefore, they are difficult to remove. Organic impurities occurring from remaining photoresists or the like are difficult to completely remove even with an oxidizing cleaning agent.

With the conventional cleaning method disclosed in the Japanese Non-Examined Patent Publication No. 56-150818, chlorine-containing pure water in which the contents of hypochlorous acid and hypochlorous acid ions are held to 0.1 ppm or below is used as a cleaning agent instead of simple pure water. However, the chlorine contained in the cleaning agent exists as "free chlorine" and consequently, it is not stable. For example, it can readily generate chlorine ions under heat or the like. Thus, this conventional cleaning agent is not practically effective if it is used for removing metallic impurities.

The conventional wet treatment method filed as the Japanese Patent Application No. 6-56106 has an object of decreasing greatly the necessary amounts of high-purity chemicals, and this object can be accomplished with the use of the "electrolysis-activated water". However, in this method, to increase the efficiency of electrolysis, a high voltage needs to be applied to the "electrolysis-activated water" together with the addition of an electrolyte. Thus, it is difficult for this method to significantly reduce power consumption.

Further, the "electrolysis-activated water" has a disadvantage of instability at room temperature. The instability leads to high cleaning performance or effect on one hand, however, it means that the cleaning effect may be lowered before the time of a cleaning process on the other hand. Therefore, the instability is a critical defect for some cleaning processes in which the stability of the cleaning effect is essential.

For example, with the conventional wet treatment method filed as the Japanese Patent Application No. 6-56106, the cleaning effect lowering or degradation of the anode water obtained in the anode area of the electrolysis tank is less than that of the cathode water which is obtained in the cathode area thereof. Even for the anode water whose cleaning effect lowering is relatively less, the Oxidation Reduction Potential (ORP) at room temperature is lowered from 1200 mV to below 1000 mV just after the finish of production in approximately 70 hours. On the other hand, the hydrogen ion concentration, i.e., pH, is kept unchanged.

For removal of the metallic impurities adhered on semiconductor substrates, not only the pH value of the cleaning agent but also the ORP value thereof govern the removing or cleaning performance. For removal of the organic impurities adhered on semiconductor substrates, only the ORP value governs the removing performance. Thus, the above ORP lowering of the cleaning agent is critical for these impurities.

With the conventional wet treatment method filed as the Japanese Patent Application No. 6-56106, it is very difficult to prevent the cleaning effect of the "electrolysis-activated water" from lowering. In other words, there are limitations in maintaining the stability the cleaning property of the "electrolysis-activated water" as with popular chemicals in the above conventional cleaning methods.

SUMMARY OF THE INVENTION

Accordingly, an object of the present invention is to provide a cleaning method and a cleaning system of a semiconductor substrate that enables a decrease in the fabrication cost of a semiconductor device and in the adverse effects on the earth environment.

Another object of the present the invention is to provide a cleaning method and a cleaning system of a semiconductor substrate in which a large quantity of chemicals need not to be used and the power consumption can be minimized while the performance of removing the metallic and organic impurities remaining on the surface of a semiconductor substrate is equivalent with or higher than that obtained with the conventional methods.

A further object of the present the invention is to provide a production method of a cleaning solution that is used in the cleaning method and the cleaning system of the invention.

The above objects together with others not specifically mentioned will become clear to those skilled in the art from the following description.

A cleaning method of a semiconductor substrate according to a first aspect of the present invention includes a step of supplying a pure water to a cleaning tank; a step of supplying a chlorine gas to the pure water to thereby generate $Cl_x^-$ ions, i.e., chloride ($Cl^-$) ions, hypochlorite ($ClO^-$) ions, chlorite ($ClO_2^-$) ions, and chlorate ($ClO_3^-$) ions in the pure water; and a step of immersing a semiconductor substrate in the pure water containing the $Cl_x^-$ ions.

With the cleaning method according to the first aspect, the pure water becomes acid due to the supplied chlorine gas. Each of the $ClO_x^-$ ions contained in the pure water has a strong oxidizing power in an acidic atmosphere.

Therefore, metallic impurities adhered onto the semiconductor substrate are oxidized and dissolved by the oxidizing power of the hypochlorous acid ions and chloric acid ions, thereby being removed from the substrate.

Also, the chloride ($ClO^-$) ions contained in the pure water make a metallic complex salt or salts from the dissolved metallic impurities. Thus, the removed metallic impurities are prevented from being adhered onto the substrate again.

For organic impurities adhered onto the substrate, they are removed in the same way as that of the metallic impurities. Specifically, the organic impurities are decomposed by the oxidizing power of the $ClO_x^-$ ions to be dissolved, thereby being removed from the substrate in the form of carbon dioxide ($CO_2$) and water ($H_2O$)

Through this process, the organic impurities are decomposed to minimum units rather than simply separated from the semiconductor substrate. Thus, there is no possibility that they are adhered onto the substrate again.

Thus, with the cleaning method according to the first aspect of the invention, only the chlorine gas needs to be supplied to the pure water in the cleaning tank, and therefore not only the fabrication cost of the semiconductor device but also adverse effects on the earth environment can be decreased.

Further, because the pure water containing the $ClO_x^-$ ions ($Cl^-$, $ClO^-$, $ClO_2^-$ and $ClO_3^-$) having a strong oxidizing power in an acidic atmosphere is used as a cleaning solution, the performance of removing the metallic and organic impurities adhered onto the semiconductor substrate can be equivalent with or higher than that obtained with the conventional system. This means that a large quantity of chemicals need not be used.

Additionally, the cleaning solution is produced by simply supplying the chlorine gas to the pure water and therefore, the power consumption can be minimized.

The pure water preferably has a resistivity equal to or greater than 18 MΩ•cm.

In a preferred embodiment of the cleaning method, the amount of the dissolved chlorine in the pure water gas is in the range from 0.003 to 0.3% by weight. If it is less than 0.003% by weight, a satisfactorily large amount of $ClO_x^-$ ions ($Cl^-$, $ClO^-$, $ClO_2^-$ and $ClO_3^-$) is difficult or impossible to generate.

On the other hand, the saturation content value of the dissolved chlorine gas is approximately 0.6 wt %. If it is greater than 0.3% by weight, chloric acid species of ions are not efficiently generated. Further, there arises the possibility that the chlorine exists in the pure water in the gaseous state and excessive chlorine gas dissolved into the pure water tends to vaporize into the atmospheric air, resulting in extreme danger.

This concentration range of 0.003 to 0.3 wt % can provide a cleaning solution having a pH of 3 or higher and an oxidation reduction potential (ORP) of 1000 mV or higher. With this range, the concentration of chloric acid species of ions may be in the range of 0.1 to 0.001 wt %.

In another preferred embodiment of the cleaning method, the temperature of the pure water supplied with the chlorine gas is in the range from 0 to 70° C. If it is lower than 0° C., the pure water tends to freeze. If it is higher than 70° C., the dissolved chlorine gas tends to vaporize into the atmospheric air.

In a further preferred embodiment of the cleaning method, ultraviolet (UV) light (for example, the wavelength of which is equal to or shorter than 340 nm) is irradiated to the pure water containing the $Cl^-$ ions and $Cl_x^-$ ions during the step of immersing the substrate. In this case, the removal efficiency for the metallic and organic impurities increases.

In still another embodiment of the cleaning method, the metallic composite salts and chlorine contained in the pure water are removed by a cation exchange resin. In this case, the ion-containing pure water is subjected to a cation exchange process to thereby reproduce the original, clean pure water. In other words, the cleaning solution can be recycled.

It is preferred that the cleaning method is performed while screening the irradiation of visible light and/or UV light to the pure water containing the $Cl^-$ ions and $Cl_x^-$ ions before the step of immersing the substrate. The hypochlorous acid ion has a property which causes it to be decompose when subjected to visible and/or UV light.

The pure water is preferably heated during the step of immersing the substrate, because the removal efficiency for the metallic and organic impurities increases. Also, the pure water is preferably cooled before and after the step of immersing the substrate to avoid decomposition of the $ClO_x^-$ ions.

A cleaning system of a semiconductor substrate according to a second aspect of the present invention includes a cleaning tank in which a cleaning action to a semiconductor substrate is performed; a pure water supplying system for supplying a pure water to the tank; and a chlorine gas supplying system for supplying a chlorine gas to the pure water existing in the tank.

The chlorine gas reacts with the pure water to generate $ClO_x^-$ ions ($Cl^-$, $ClO^-$, $ClO_2^-$ and $ClO_3^-$). The pure water containing the $ClO_x^-$ ions is used as a cleaning solution for the semiconductor substrate placed in the tank.

With the cleaning system according to the second aspect, the pure water is supplied to the cleaning tank by the pure water supplying system, and the chlorine gas is supplied to the pure water existing in the tank by the chlorine gas supplying system to thereby generate $ClO_x^-$ ions ($Cl^-$, $ClO^-$, $ClO_2^-$ and $ClO_3^-$) in the pure water. Accordingly, this cleaning system can be used for the cleaning method according to the first aspect.

A production method of a cleaning solution according to a third aspect of the present the invention includes a step of preparing a pure water in a container; and a step of supplying a chlorine gas to the pure water to thereby generate $ClO_x^-$ ions ($Cl^-$, $ClO^-$, $ClO_2^-$ and $ClO_3^-$) in the pure water.

In a preferred embodiment of the production method, the amount of the chlorine gas dissolved in the pure water is in the range from 0.003 to 0.3% by weight.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
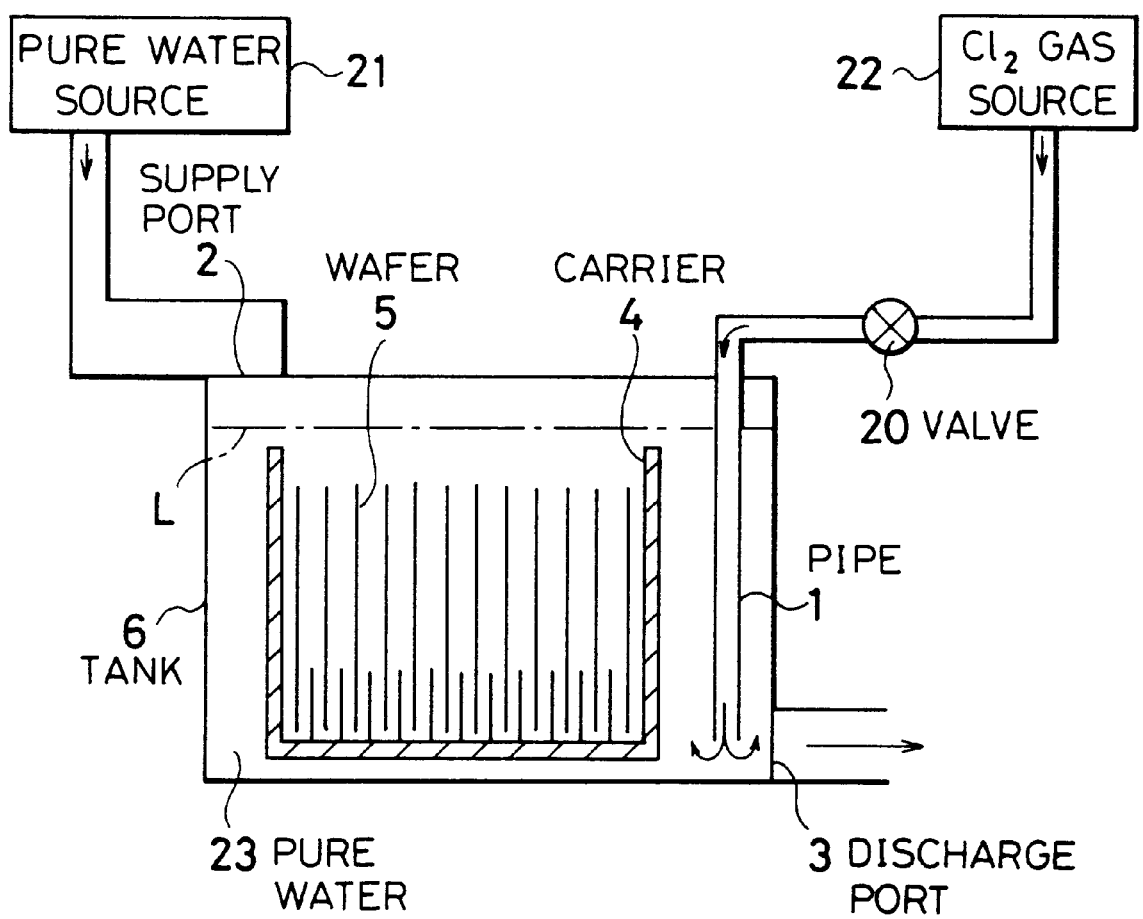
FIG. 1 is a schematic view of a cleaning system of a semiconductor substrate, which is used for a cleaning method according to a first embodiment of the invention.

Preferred embodiments of the present invention will be described in detail below while referring to the drawings attached.

FIRST EMBODIMENT

A cleaning system of a semiconductor substrate shown in FIG. 1 has a cleaning tank 6 with a supply port 2 and a discharge port 3. A pure water 23 is supplied from a pure water source 21 to the tank 6 through the opened supply port 2. The pure water 23 existing in the tank 6 is discharged through the opened discharge port 3. The reference character L denotes the top level of the water 23 in the tank 6.

The cleaning system further has a pipe 1 through which a chlorine ($Cl_2$) gas is supplied from a chlorine gas source 22 to the tank 6. The open end of the pipe 1 is placed near the bottom of the tank 6. The $Cl_2$ gas is bubbled into the pure water 23 existing in the tank 6 through the open end. This structure is suitable for efficiently producing a cleaning fluid that contains chloric acid species of ions.

An adjusting valve 20 is provided in the path of the pipe 1. By adjusting this valve 20, the flow rate of the $Cl_2$ gas is changed.

In FIG. 1, a plurality of silicon substrates or wafers 5 to be cleaned, which are held on a wafer carrier 4, are placed in the tank 6.

The cleaning tank 6, the supply port 2 and the discharge port 3 are made of polyetheretherketone (PEEK). The inside wall of the pipe 1 is made of PEEK, while the outside wall thereof is made of stainless steel. This stainless steel is made non-conductive by chrome doping. The wafer carrier 4 also is made of PEEK. This is because the amount of particles or organic impurities eluted from PEEK is smaller than that from other resins such as polytetrafluoroethylene (PTFE) or polypropylene (PP). Another reason is that PEEK has a heat deformation temperature of 152° C., and a tensile strength of 930 kgf/cm$^2$ and therefore, PEEK has sufficient heat and pressure resistances. In addition, as is generally known, PEEK is black, which makes it possible to screen or cut off light such as UV light and visible light.

Next, a cleaning method of a semiconductor substrate according to a first embodiment is explained.

First, after opening the supply port 2 and closing the discharge port 3, the pure water 23 is supplied to the cleaning tank 6 from the pure water source 21 until the top level L of the water 23 reaches a specified height from the bottom of the tank 6. Then, the supply port 2 is closed.

Next, a $Cl_2$ gas is supplied from the $Cl_2$ gas source 22 to the pure water 23 existing in the tank 6 through the pipe 1. The $Cl_2$ gas is bubbled into the water 23 through the open end of the pipe 1 to be dissolved therein. Thus, chlorine ions ($Cl^-$), hypochlorite ions ($ClO^-$), chlorite ions ($ClO_2^-$), and chlorate ions ($ClO_3^-$) are generated in the water 23.

The amount of the dissolved chlorine in the pure water 23 is controlled to be in the range from 0.003 to 0.3% by weight by adjusting the valve 20 provided in the pipe 1.

Subsequently, the wafer carrier 4 holding the semiconductor wafers 5 thereon is immersed in the pure water 23 containing the $Cl^-$ ions and $ClO_x^-$ ions ($ClO^-$, $ClO_2^-$, $ClO_3^-$) through an opening (not shown) of the tank 6. The wafers 5 are kept immersed in the water 23 for a specified time (for example, 10 minutes).

Finally, the wafer carrier 4 holding the wafers 5 thereon is taken out from the pure water 23 and the tank 6. Then, the discharge port 3 is opened to discharge the pure water 23 existing in the tank 6.

The pure water 23 in the tank 6 becomes acid due to the supplied $Cl_2$ gas and therefore. Each of the $ClO_x^-$ ions existing in the pure water 23 has a strong oxidizing power in an acidic atmosphere. Accordingly, metallic impurities adhered onto the wafers 5 are oxidized and dissolved by the oxidizing power of the $ClO_x^-$ ions. Thus, the metallic impurities are removed from the wafers 5.

Also, the $Cl^-$ ions contained in the pure water 23 make a metallic complex salt or salts from the dissolved metallic impurities. Thus, the removed metallic impurities are prevented from being adhered onto the wafers 5 again.

Organic impurities adhered onto the wafers 5 are removed in the same way as that of the metallic impurities. Specifically, the organic impurities are decomposed by the oxidizing power of the $ClO_x^-$ ions to be dissolved in the water 23. Thus, they are removed from the wafers 5 in the states of $CO_2$ and $H_2O$.

Through this process, the organic impurities are decomposed to minimum units rather than simply separated from the wafers 5. Therefore, there is no possibility that they are adhered onto the wafers 5 again.

As described above, with the cleaning method according to the first embodiment, only the $Cl_2$ gas needs to be supplied to the pure water 23 in the cleaning tank 6, not only the fabrication cost of the semiconductor device that will be produced from the wafers 5 but also adverse effects on the earth environment can be decreased.

Further, because the pure water 23 containing the $ClO_x^-$ ions having strong oxidizing power is used as a cleaning solution, the performance of removing the metallic and organic impurities adhered onto the wafers 5 can be equivalent with or higher than that obtained with the conventional ones. This means that a large quantity of chemicals need not be used.

Additionally, the cleaning solution is produced by simply supplying the $Cl_2$ gas to the pure water 23 and therefore, the power consumption can be minimized.

To confirm the removal performance of metallic impurities from a silicon wafer, the following test was performed by the inventor, Y. Siramizu.

First, an ultrapure water was supplied from the pure water source 21 to the cleaning tank 6 through the supply port 2. The resistivity of the ultrapure water was 18 MΩ·cm or higher.

Then, a high-purity $Cl_2$ gas was supplied from the $Cl_2$ gas source 22 through the pipe 1 to the ultrapure water. The supply of $Cl_2$ gas was controlled to keep the content of $Cl_2$ dissolved in the water at 0.3%. Here, the term "high-purity" means that the total amount of metallic impurities contained in the $Cl_2$ gas is in the order of ppt or less.

When $Cl_2$ gas was bubbled into the ultrapure water, the $Cl_2$ gas reacted with the ultrapure water to thereby generate $ClO_x^-$ ions ($ClO^-$, $ClO_2^-$ and $ClO_3^-$) at a high yielding rate according to the following equations (1), (2), (3) and (4).

$$Cl_2 + 2H_2O \longrightarrow 2H^+ + 2HClO + 2e^- \quad (1)$$

$$2HClO \longrightarrow 2H^+ + 2ClO^- \quad (2)$$

$$Cl_2 + 6H_2O \longrightarrow 12H^+ + 2ClO_3^- + 10e^- \quad (3)$$

$$Cl_2 + 4H_2O \longrightarrow 8H^+ + ClO_2^- + 6e^- \quad (4)$$

Thus, the ultrapure water contains $Cl^-$ ions, $HClO^-$ ions, $ClO_2^-$ ions, and $ClO_3^-$ ions as an anion. This water further contains hydrogen ions ($H^+$) only as a cation, with no ions of alkali metals such as sodium (Na), alkali earth metals such as Magnesium (Mg), and quaternary amines such as ammonium ($NH_4$) being included.

Because the amount of the dissolved $Cl_2$ is 0.3 wt %, the cleaning solution has a pH of 3 or higher and an ORP of 1000 mV or higher. With this range, the total amount of the $ClO_x^-$ ions is in the range of 0.1 to 0.001 wt %.

The above operations were made at a room temperature (20° C.) while UV light and visible light was cut off to minimize the deterioration of the cleaning solution.

Subsequently, silicon wafers whose surfaces were intentionally contaminated with Fe and Cu on the order of $1 \times 10^{12}$ atoms/cm$^2$ were dipped with the wafer carrier 4 into the ion-containing ultrapure water (i.e., cleaning solution) in the cleaning tank 6 for 10 minutes.

Figure 2:
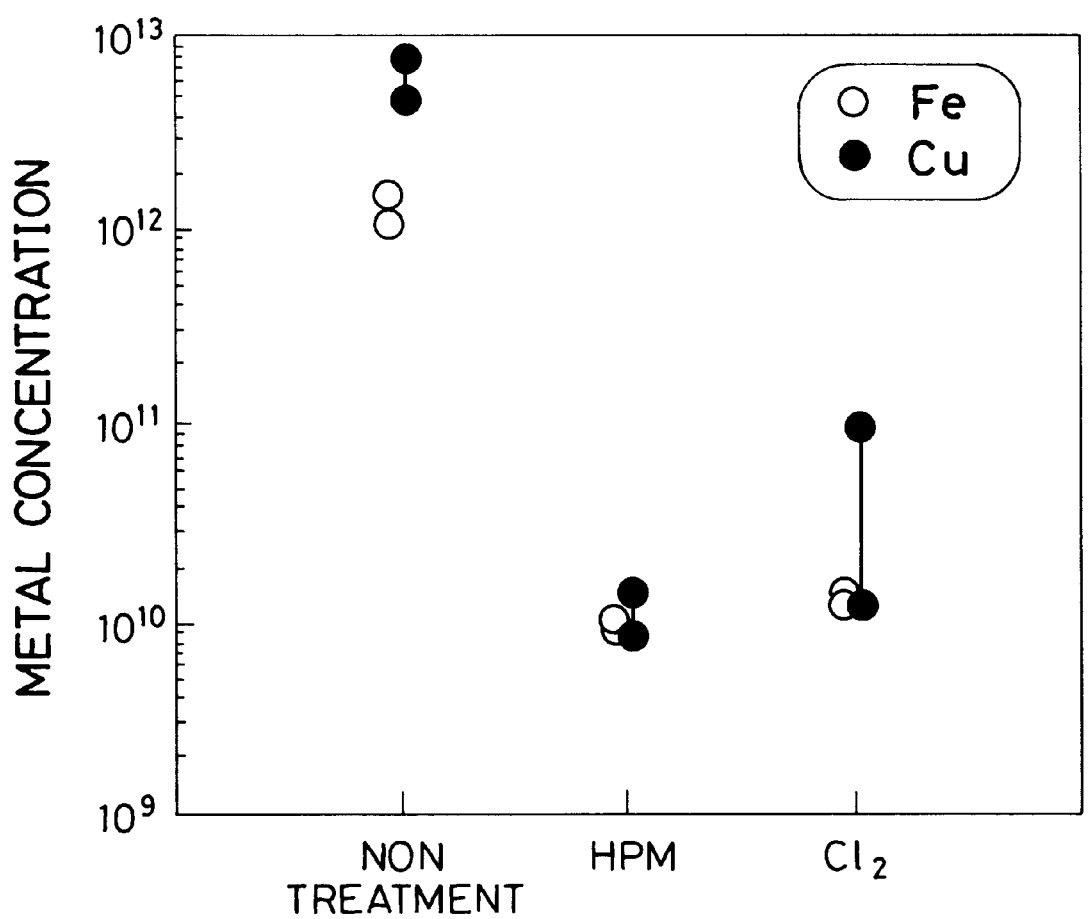
FIG. 2 is a graph showing the removal effect of Fe and Cu contaminants obtained by the cleaning method according to the first embodiment.

FIG. 2 shows the result of this test. As seen from FIG. 2, the amount of Cu was reduced from the order of $1 \times 10^{12}$ atoms/cm$^2$ to the order of $1 \times 10^{10}$ atoms/cm$^2$. The amount of Fe also was decreased from the order of $1 \times 10^{12}$ atoms/cm$^2$ to the order of $1 \times 10^{10}$ atoms/cm$^2$. These results are approximately the same degree as that of the conventional HPM cleaning method.

The amounts of Fe and Cu were measured by Vapor Phase Decomposition-Atomic Absorption Spectrometry (VPD-AAS).

In the conventional cleaning method of the Japanese Non-Examined Patent Publication No. 56-150818, a cleaning solution is obtained by dissolving a trace of $Cl_2$ gas in pure water to react therewith by bubbling of the gas. The concentration of the contained hypochlorous acid ions is held to 0.1 ppm or below. However, no chlorate ions and no chlorite ions are generated because these ions cannot exist stably due to the low concentration.

SECOND EMBODIMENT

Figure 3:
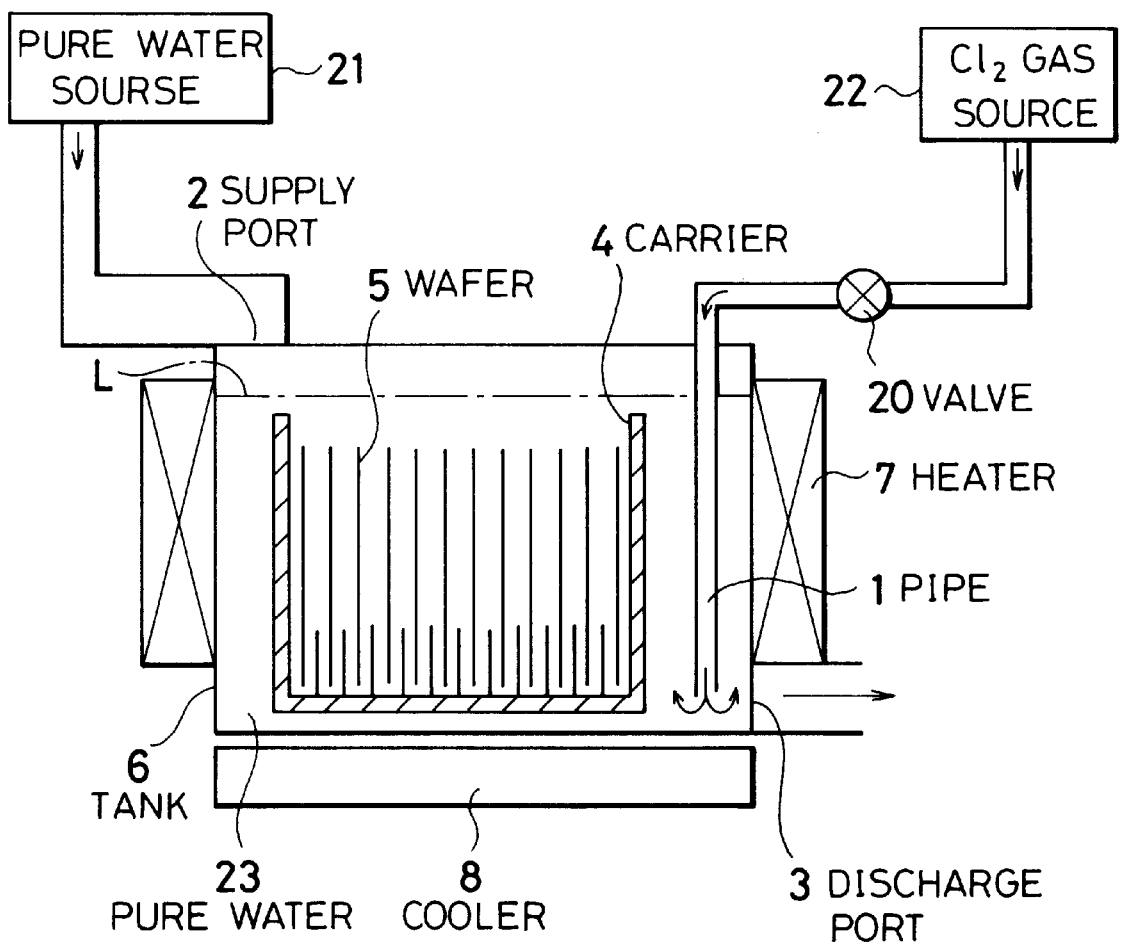
FIG. 3 is a schematic view of a cleaning system of a semiconductor substrate, which is used for a cleaning method according to a second embodiment of the invention.

A cleaning system of a semiconductor substrate shown in FIG. 3 is used for a cleaning method according to a second embodiment. This system has the same structure as that of the first embodiment except for a heater 7 and a cooler 8. Accordingly, the explanation relating to the same structure is omitted here by attaching the same reference numerals to the corresponding elements for the sake of simplification of description.

The heater 7 is fixed near the side wall of the cleaning tank 6, and is used for raising the temperature of the pure water 23 in the tank 6. Here, the heater 7 is made of a microwave oscillator to realize a rapid heating.

The cooler 8 is fixed near the bottom wall of the tank 6, and is used for lowering the temperature of the pure water 23 in the tank 6.

The cleaning solution (i.e., the pure water 23 containing the $Cl^-$, $ClO^-$, $ClO_2^-$ and $ClO_3^-$) becomes more active as the temperature of the solution increases. In other words, the decomposition of the hypochlorous acid ions is promoted by the applied heat according to the following equation (5) as $$ClO^- \rightarrow Cl^- + (O) \quad (5)$$

where the symbol (O) indicates an activated oxygen.

Therefore, if the temperature of the water 23 is raised by the operation of the heater 7 during the process step of immersing the wafers 5 into the water 23, the decomposition efficiency of the metallic and organic impurities can be accelerated due to the activated oxygen. This means that the impurity removing efficiency can be improved compared with the first embodiment.

Since the lifetime of the activated oxygen is very short, the temperature rise of the cleaning solution needs to be performed as rapidly as possible. For this reason, the microwave oscillator is used for the heater 7.

On the other hand, to avoid the unwanted decomposition of the hypochlorite ions (ClO⁻), the cleaning solution is preferably cooled by the operation of the cooler 8 except for the cleaning step.

It is preferred that the temperature of the cleaning solution is controlled to be kept in the range from 0 to 70° C.

To confirm the removal performance of metallic impurities from silicon wafers, the following test was performed by the inventor, Y. Siramizu in the same manner as that of the first embodiment except for heating and cooling processes to the cleaning solution.

The cooling process was performed in the following way. After the step of supplying the ultrapure water 23 to the cleaning tank 6, the water 23 was cooled to 10° C. by the operation of the cooler 8. During the step of supplying the $Cl_2$ gas to the water 23, the temperature of the water 23 was kept at the same temperature.

Then, prior to the step of immersing the wafers 5, the cleaning solution was heated up to 60° C. by the operation of the heater 7 at a raising rate of 15 to 20° C./min. Following this heating process, the wafers 5 were immersed into the solution for 10 minutes for cleaning.

The above operations were made while UV light and visible light was cut off to minimize the deterioration of the cleaning solution.

Figure 4:
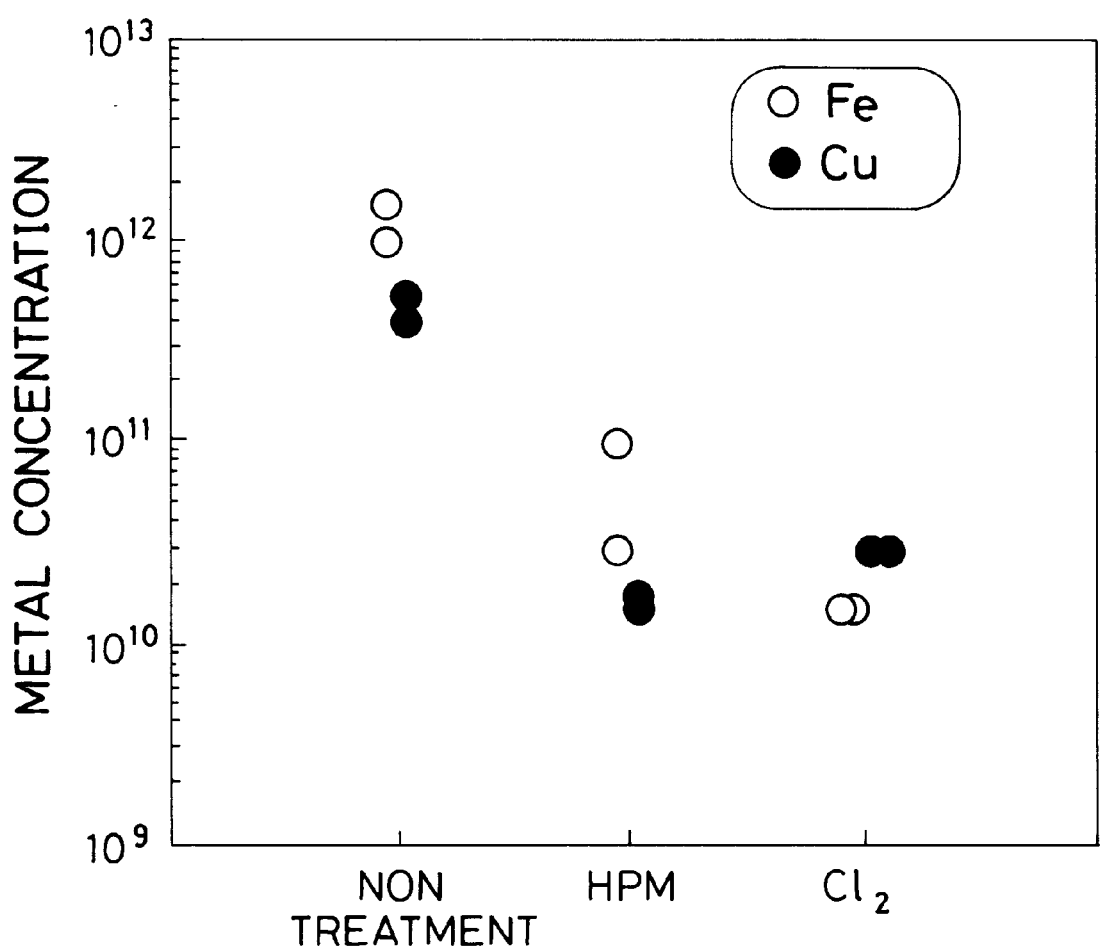
FIG. 4 is a graph showing the removal effect of Fe and Cu contaminants obtained by the cleaning method according to the second embodiment.

FIG. 4 shows the result of this test. As seen from FIG. 4, the amount of Cu was reduced from the order of $1 \times 10^{12}$ atoms/cm², to the order of $1 \times 10^{10}$ atoms/cm², which is approximately equal to that of the conventional HPM method. The amount of Fe also was decreased from the order of $1 \times 10^{12}$ atoms/cm² to the order of $1 \times 10^{10}$ atoms/cm², which is slightly better than that of the conventional HPM method.

These results are slightly better than that of the first embodiment because the heating and cooling processes are added.

THIRD EMBODIMENT

Figure 5:
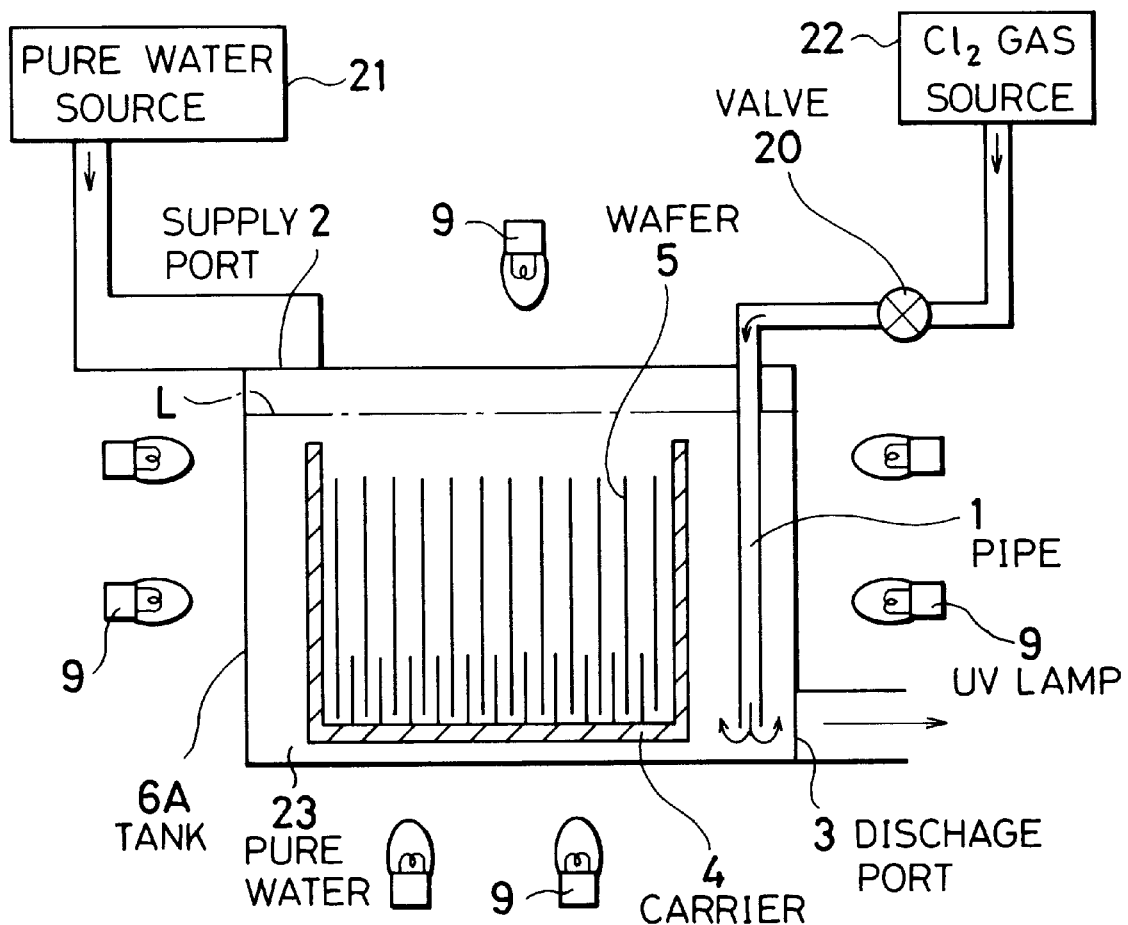
FIG. 5 is a schematic view of a cleaning system of a semiconductor substrate, which is used for a cleaning method according to a third embodiment of the invention.

A cleaning system of a semiconductor substrate shown in FIG. 5 is used for a cleaning method according to a third embodiment. This system has the same structure as that of the first embodiment except that a cleaning tank 6A made of high-purity quartz is provided and that a plurality of UV lamps 9 are provided near the side and bottom walls of the tank 6A. Accordingly, the explanation relating to the same structure is omitted by attaching the same reference numerals to the corresponding elements for the sake of simplification.

The UV lamps 9 are used for generating and irradiating UV light (the wavelength of which is 200 to 300 nm) to the cleaning solution.

The cleaning solution becomes more active due to UV light irradiation and accordingly, the decomposition of the hypochlorous acid ions is promoted by the applied light according to the above equation.

Therefore, if the Uw light is irradiated to the solution by the operation of the lamps 9 during the process step of immersing the wafers 5 into the solution, the decomposition efficiency of the metallic and organic impurities can be accelerated due to the activated oxygen. This means that the impurity removing efficiency can be improved compared with the first embodiment.

Since the cleaning tank 6A is made of quartz rather than PEEK, the entire solution can be irradiated to the UV light.

To confirm the removal performance of metallic impurities from silicon wafers, the same test as that of the first embodiment was performed by the inventor, Y. Siramizu, except for addition of the UW light irradiation.

Approximately the same results as those of the second embodiment were obtained in the third embodiment.

FOURTH EMBODIMENT

Figure 6:
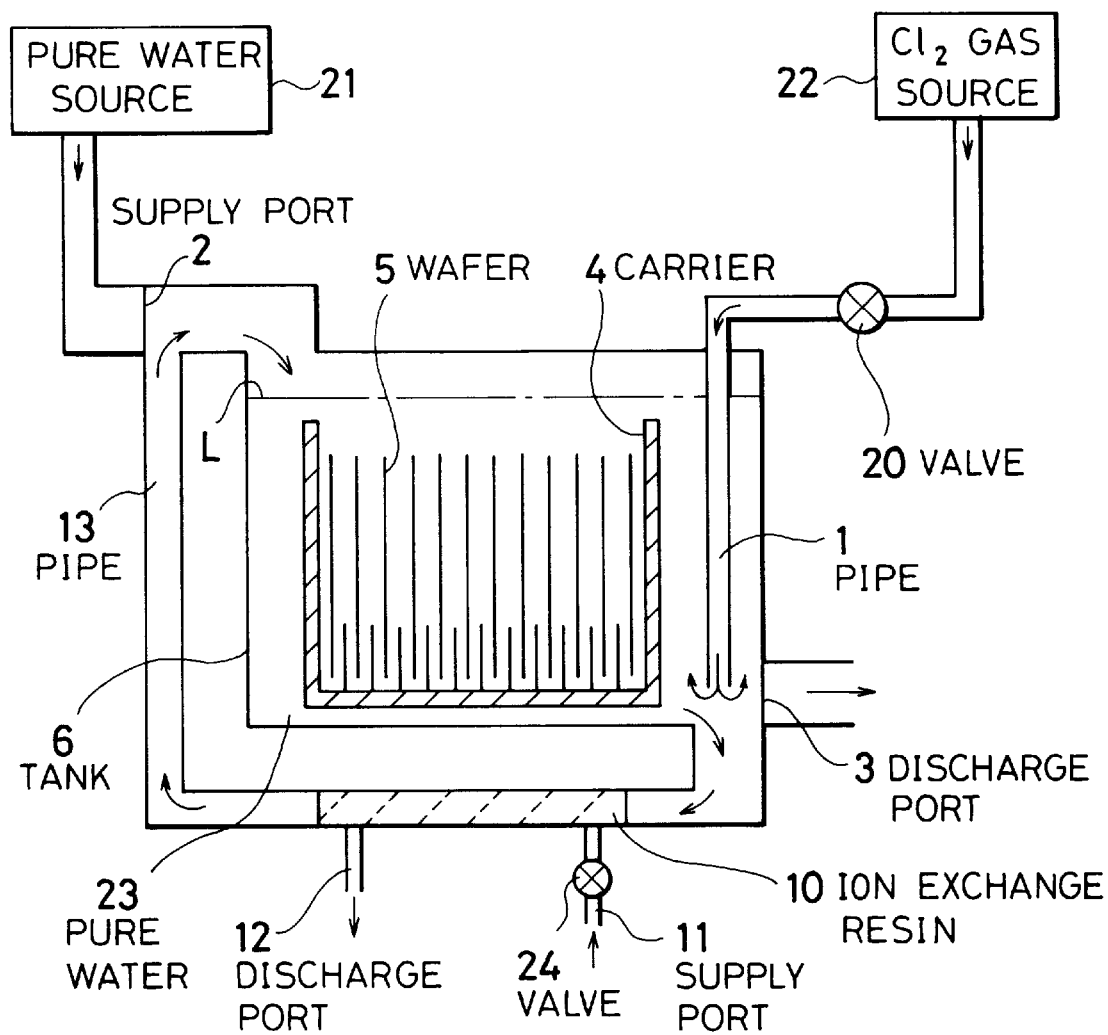
FIG. 6 is a schematic view of a cleaning system of a semiconductor substrate, which is used for a cleaning method according to a fourth embodiment of the invention.

A cleaning system of a semiconductor substrate shown in FIG. 6 is used for a cleaning method according to a fourth embodiment. This system has the same structure as that of the first embodiment except that a returning pipe 13 is additionally provided to the cleaning tank 6 to connect the discharge port 3 with the supply port 2.

An ion exchange resin 10 for exchanging strong acid cations is disposed along the path of the returning pipe 13. A carrier solution is supplied to the returning pipe 13 through a supply port 11, and is discharged from the pipe 13 through a discharge port 12. Thus, the cleaning solution, i.e., the ion-containing ultrapure water 23, existing in the tank 6 is recycled by the action of the carrier solution.

As the carrier solution, a diluted alkaline solution such as a water solution of a carbonate.

Next, a cleaning method for a semiconductor substrate according to the fourth embodiment is explained.

The process steps of supplying the ultrapure water 23 to the tank 6, supplying the $Cl_2$ gas to the water 23 in the tank 6, and dipping the wafers 5 into the cleaning solution are performed in the same manner as that of the first embodiment.

Next, the cleaning process is performed while cycling the cleaning solution through the returning pipe 13. Then, the wafers 5 are taken out from the tank 6.

To confirm the removal performance of metallic impurities from silicon wafers, the same test as that of the first embodiment was performed using the cleaning system shown in FIG. 6.

During the cleaning process, the cleaning solution or ultrapure water 23 was sent to the returning pipe 13 to pass through the ion exchange resin 10 with a high exchange capacity for strong acid cations. Metallic complex salts $M(Cl)_x$ such as $Cu(H_2O)_6^{2+}$, as well as the chlorine ions, were removed by the resin 10. The ion-removed cleaning solution was then returned back to the cleaning tank 6.

To cause a rapid ion exchange reaction, a pure water or diluted alkaline solution was fed as the carrier solution through the supply port 11, and discharged through the discharge port 12, thereby circulating the carrier solution.

To keep the volume of the cleaning solution at a fixed value, the ultrapure water 23 was additionally supplied to the tank 6. $Cl_2$ gas was occasionally supplied to the tank 6.

Table 1 gives the amounts of Fe and Cu contained in the cleaning solution before and after recycling. As can be seen from Table 1, after cleaning, the amounts of Fe and Cu eluted from the surfaces of the wafers 5 were increased, while after recycling, the levels of Fe and Cu in the cleaning solution were returned to those before wafer cleaning.

TABLE 1

|  | Impurity (ppb) | |
| --- | --- | --- |
| Cleaning Solution | Fe | Cu |
| Just After Production | 0.05 | 0.03 |
| After Wafer Cleaning | 0.5 | 0.5 |
| Just After Recycling | 0.03 | 0.02 |

This recycling process can be repeated until the total ion exchange amount reaches the exchange capacity of the resin 10 (typically, approximately 10%). The resin 10 can be reused by removing the resin 10 from the pipe 13 and cleaning it with a strong acid and an organic solvent.

With a $Cl_2$ content of 0.3%, the recycling process could be repeated continuously approximately 10 times.

Preferably, as the ion exchange resin 10, a combination of two elements of an H$^+$-type resin and an Ag$^+$-type resin are used. These two resins are a styrene basic material with a crosslinking degree of 15 to 20% produced through modification with sulfonic group. The Ag$^+$-type resin is produced by replacing the H atoms with Ag atoms.

The H$^+$-type resin has a high selectivity for the transition metals, while the Ag$^+$-type resin is suitable for separating out the Cl$^-$, Br$^-$, and I$^-$ ions contained in the cleaning solution as silver halides.

The above first to fourth embodiments have been described separately, however, at least two of them can be suitably combined with one another, and by doing so, the cleaning performance, i.e., the removing performance for the metallic and organic impurities will be improved.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A cleaning system for a semiconductor substrate comprising:

a cleaning tank in which a cleaning action on a semiconductor substrate is performed;

a pure water supplying system for supplying pure water to the tank; and a chlorine gas supplying system for supplying a chlorine gas to the pure water existing in the tank so that said chlorine gas reacts with said pure water in said tank to generate ClO$_x$– ions, whereby said pure water containing said ClO$_x$– ions can be used as a cleaning solution for said semiconductor substrate placed in said tank.

2. The system as claimed in claim 1, further comprising a heater for heating said pure water containing said chlorine gas in said tank.

3. The system as claimed in claim 2, wherein said heater is made of a microwave oscillator.

4. The system as claimed in claim 1, further comprising a cooler for cooling said pure water containing said chlorine gas in said tank.

5. The system as claimed in claim 1, further comprising an ultriviolet light source for irradiating ultraviolet light to said pure water containing said ClO$_x$– ions in said tank while said substrate is immersed therein.

6. The system as claimed in claim 1, further comprising an ion exchange resin for removing metallic composite salts and chlorine contained in said pure water.

7. The system as claimed in claim 1, further comprising a screen for cutting off at least one of irradiation of visible light and ultraviolet light to said pure water containing said ClO$_x^-$ ions in said tank.

* * * * *